United States Patent
Lam

(10) Patent No.: US 10,067,425 B2
(45) Date of Patent: Sep. 4, 2018

(54) CORRECTING EUV CROSSTALK EFFECTS FOR LITHOGRAPHY SIMULATION

(71) Applicant: Mentor Graphics Corporation, Wilsonville, OR (US)

(72) Inventor: Michael Lam, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/472,364

(22) Filed: Mar. 29, 2017

(65) Prior Publication Data
US 2017/0285490 A1 Oct. 5, 2017

Related U.S. Application Data

(60) Provisional application No. 62/314,655, filed on Mar. 29, 2016.

(51) Int. Cl.
*G03B 27/42* (2006.01)
*G03F 7/20* (2006.01)
(52) U.S. Cl.
CPC .................. *G03F 7/70625* (2013.01)
(58) Field of Classification Search
CPC ..... G03F 7/70433; G03F 1/22; G03F 7/70625
USPC ............. 355/52, 53, 55; 430/5, 20, 30
See application file for complete search history.

(56) References Cited

U.S. PATENT DOCUMENTS

| 8,056,024 B2 * | 11/2011 | Lin | G06F 17/5081 716/51 |
| 8,539,393 B2 * | 9/2013 | Word | G03F 7/70433 716/51 |
| 2007/0105029 A1 * | 5/2007 | Ausschnitt | B81C 99/0065 430/30 |
| 2008/0077362 A1 * | 3/2008 | Willis | G03F 7/70516 702/189 |

OTHER PUBLICATIONS

Lam et al., "Accurate 3DEMF mask model for full-chip simulation," Proc. SPIE, vol. 8683, 2013.

* cited by examiner

*Primary Examiner* — Hung Henry Nguyen

(57) ABSTRACT

Disclosed are techniques for correcting the EUV crosstalk effects. Isolated mask feature component diffraction signals associated with individual layout feature components are determined based on a component-based mask diffraction modeling method such as a domain decomposition method. Mask feature component diffraction signals are then determined based on the isolated mask feature component diffraction signals, layout data and predetermined crosstalk signals. Here, the predetermined crosstalk signals are derived based on mask feature component diffraction signals computed using an electromagnetic field solver and the component-based mask diffraction modeling method, respectively. The mask feature component diffraction signals are then used to process layout designs.

20 Claims, 9 Drawing Sheets

Flow chart 800

CORRECTING EUV CROSSTALK EFFECTS FOR LITHOGRAPHY SIMULATION

RELATED APPLICATIONS

This application claims the benefit of U.S. Provisional Patent Application No. 62/314,655, filed on Mar. 29, 2016, entitled "Multilayer Energy Drift And Double Diffraction In EUV Mask Reflections," and naming Michael Lam as inventor, which application is incorporated entirely herein by reference.

FIELD OF THE DISCLOSED TECHNOLOGY

The present disclosed technology relates to the field of lithography. Various implementations of the disclosed technology may be useful for correcting the EUV mask crosstalk effect.

BACKGROUND OF THE DISCLOSED TECHNOLOGY

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

In a conventional OPC process, the edges of the geometric elements in the design are fragmented. For example, as shown in FIG. 3A, an edge of the geometric element 301 used to create a mask feature 300 may be fragmented into edge fragments 301A-301F, shown in FIG. 3B. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments.

The model-based OPC process also simulates the printed image. That is, the photolithographic process is simulated in order to produce a simulated printed image (referred to as simulated image), such as the example image 302 shown in FIG. 3A. This simulated image is compared to the target image. Typically, this comparison is done at each edge fragment. For example, as shown in FIG. 3C, the target image is a distance d1 away from the simulated image at the edge fragment 301A, the target image is a distance d2 away from the simulated image at the edge fragment 301C, while the target image intersects the simulated image at the edge fragment 301B. The distances between the target image and the simulated image are often referred to as the edge placement error (EPE). Accordingly, in most conventional model-based OPC processes each edge fragment or unfragmented edge has an associated edge placement error (also referred to as an associated edge placement error value).

Next, the edge fragments are individually moved or adjusted in order to enable the simulated image for the resulting mask to reproduce the target image as much as possible. For example, as shown in FIG. 3D, the edge fragment 301A is displaced in a direction away from the geometric element 301, in an effort to widen the corresponding portion of the image that would be produced by the resulting mask. Similarly, the edge fragment 301C is displaced in a direction toward from the geometric element 301, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

The performance of an OPC process depends in part on the accuracy and predictability of lithographic process models that mathematically represent the distinct steps in the patterning sequence. These lithographic process models (sometimes also referred to as OPC models) include optical models for aerial image formation and resist/etch process models for the photoresist-associated steps such as exposure, post-exposure bake, development, and pattern transfer. The task of understanding the impact of a whole series of parameters that affect the lithographic performance in complex and intertwined ways is challenging. One of the major challenges is the three-dimensional simulation of large non-periodic mask layouts since the traditional Kirchhoff thin mask model leads to large errors at 20 nm and below.

Various techniques decompose mask layouts into individual layout feature components for the rapid and accurate simulation of light scattering from masks. One example is the domain decomposition method (DDM). DDM allows the user to arbitrarily decompose the domain into pieces, and synthesize a near field mask solution from the subsequent building blocks. Details concerning the DDM technology are provided in K. Adam and A. R. Neureuther, "Domain decomposition methods for the rapid electromagnetic simulation of photomask scattering," J. Microlithogr. Microfabrication, Microsyst. 1, 253 (2002); K. Adam, "Modeling of electromagnetic effects from mask topography at full-chip scale," Proc. SPIE 5754, 498 (2004); K. Adam, "Domain Decomposition Methods for the Electromagnetic Simulation of Scattering from Three-Dimensional Structures with Applications in Lithography," Ph. D Dissertation, University of California at Berkeley, 2001; and U.S. Pat. Nos. 7,536,660; 7,539,954; 7,836,423; 8,645,880, all of which are hereby incorporated herein by reference.

The original DDM technique used normal incidence illumination of the mask combined with the Hopkins approximation to model oblique incidence scattering in the illumination. With the rise of hyper-NA lithographic systems, the Hopkins' approximation has been shown to be insufficient for the modeling accuracy needs associated with NA's>1.0. DDM was augmented to incorporate the impact of oblique incidence illumination angles via the Hybrid Hopkins-Abbe (HHA) method, which is discussed in K. Adam et al., "Hybrid Hopkins-Abbe method for modeling oblique angle mask effects in OPC," Proc. SPIE 6924 (2008), which is hereby incorporated herein by reference.

When features on the order of the wavelength (at mask dimensions) and below are simulated with DDM, the assumption of isolated layout feature component near fields (e.g., edge near fields) that interact solely based on superposition begins to break down and a layout feature component to layout feature component interaction in the near field begins to become noticeable. One layout feature component on the mask electromagnetically interacting with another layout feature component on the mask in the near field (i.e., not yet propagating through the optical system) is referred to as crosstalk for mask diffraction/scattering (or crosstalk). This crosstalk between layout feature components such as edges can produce CD errors that are unacceptable in today's advanced processing nodes where every nm of error needs to be controlled as tightly as possible.

For deep ultraviolet (DUV) lithography, crosstalk occurs because light scattering from a single edge can be diffracted to large angles, which can propagate across a section of the mask, and re-scatter from a second edge. The highly oblique light from the first scattering would normally propagate outside the optical system (not collected) because the NA of the system is too small to resolve such high frequency information. When two edges are placed in close proximity to each other, however, highly obliquely scattered waves may propagate across the mask and re-scatter from a nearby edge and be redirected towards the collection optic, causing an impact on imaging. A crosstalk solution is discussed in Lam et al., "Accurate 3DEMF mask model for full-chip simulation," Proc. SPIE, vol. 8683, 2013, which is hereby incorporated herein by reference.

Extreme ultraviolet (EUV) lithography is a leading candidate for the next-generation lithographic solution. The current optical irradiation wavelength for EUV lithography is 13.5 nm. Unlike deep ultraviolet (DUV) lithography systems such as the 193 nm system, EUV lithography systems cannot use refractive optical elements because materials at EUV wavelengths have refractive indices which are extremely close to 1.0 (the same as air), making it difficult to bend the highly energetic light based on Snell's Law. Instead, reflective optical elements such as mirrors are needed. EUV masks also need to work in a reflective mode. A typical EUV projection printing system includes multiple mirrors. At the mask plane, the chief ray is off-axis by roughly 6 degrees but is perpendicular to the image plane (wafer plane). Thus, the system is telecentric at the wafer plane, but non-telecentric at the mask plane. Moreover, since materials at EUV wavelengths have refractive indices which are extremely close to 1.0, very small amounts of energy are contained within any reflection or diffraction (especially to high angles) because the amount of scattered energy is related to the difference in refractive indices between two mediums. Due to these differences between deep ultraviolet (DUV) lithography and extreme ultraviolet (EUV) lithography, the fundamental physical mechanism underlying crosstalk is different between the two technologies and a crosstalk solution for DUV is not effective for EUV.

BRIEF SUMMARY OF THE DISCLOSED TECHNOLOGY

Aspects of the disclosed technology relate to techniques of correcting EUV crosstalk effects in lithography. In one aspect, there is a method comprising: receiving layout data for one or more layout designs; determining isolated mask feature component diffraction signals associated with individual layout feature components in the one or more layout designs based on a component-based mask diffraction modeling method; determining mask feature component diffraction signals based on the isolated mask feature component diffraction signals, the layout data and predetermined crosstalk signals, wherein the predetermined crosstalk signals are derived based on mask feature component diffraction signals computed using an electromagnetic field solver and the component-based mask diffraction modeling method, respectively; processing the one or more layout designs based on the mask feature component diffraction signals; and storing results of the processed one or more layout designs in a tangible medium.

The processing the one or more layout designs may comprise performing simulation to generate aerial images or printed images of layout features in the one or more layout designs. The simulation may comprise applying a sum-of-coherent-systems (SOCS) method. Alternatively or additionally, the processing the one or more layout designs may comprise performing an optical proximity correction (OPC) process on the one or more layout designs.

The component-based mask diffraction modeling method is a domain decomposition method (DDM).

The predetermined crosstalk signals may be differences between the mask feature component diffraction signals for an isolated layout feature computed using the electromagnetic field solver and the mask feature component diffraction signals for the isolated layout feature computed using the component-based mask diffraction modeling method.

The determining mask feature component diffraction signals may comprise: converting layout data to binary masks; and multiplying the predetermined crosstalk signals by the binary masks.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1:
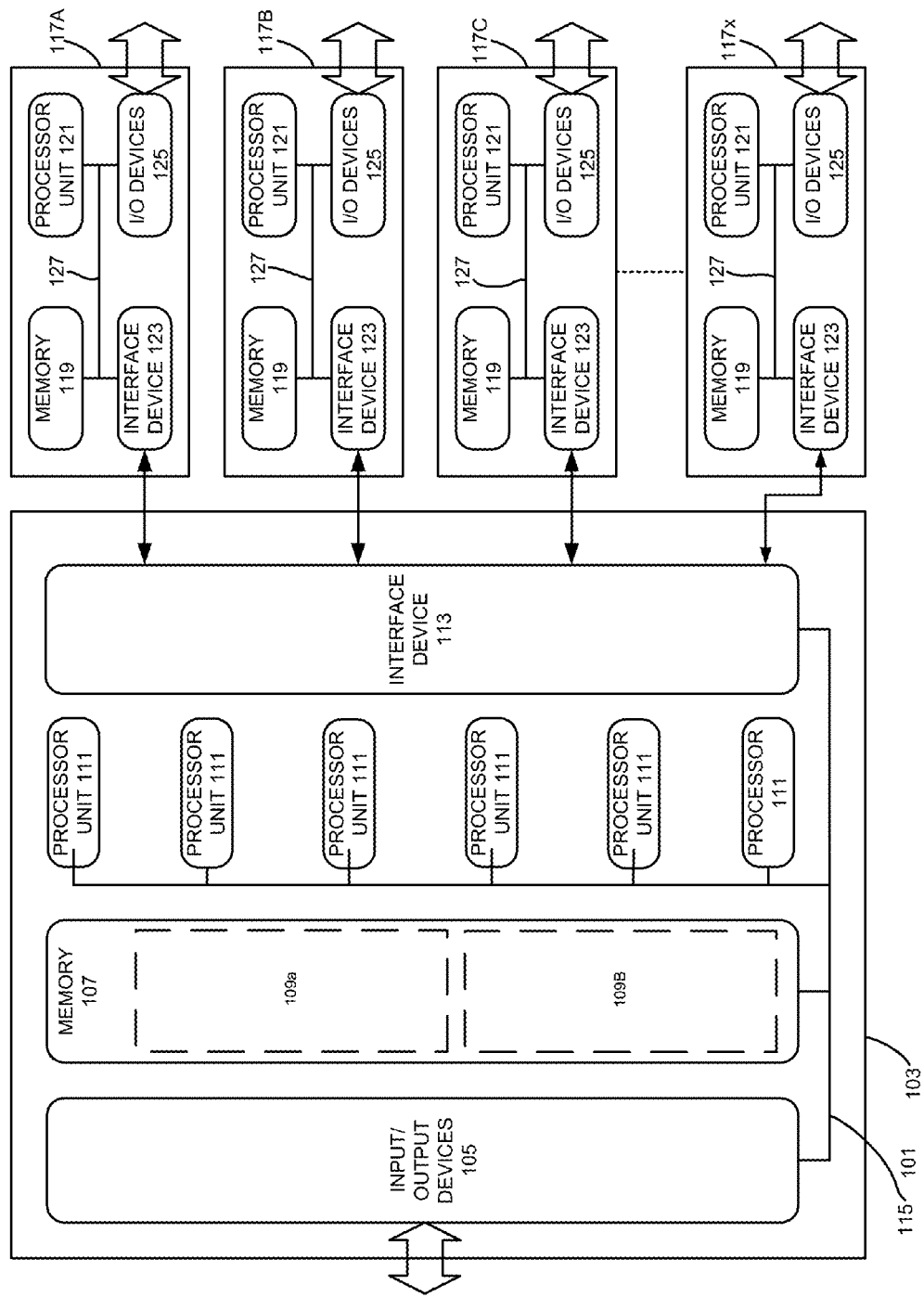
FIG. 1 illustrates an example of a computing system that may be used to implement various embodiments of the disclosed technology.

Various aspects of the present disclosed technology relate to correcting EUV crosstalk effects in lithography. In the following description, numerous details are set forth for the purpose of explanation. However, one of ordinary skill in the art will realize that the disclosed technology may be practiced without the use of these specific details. In other instances, well-known features have not been described in details to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Exemplary Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
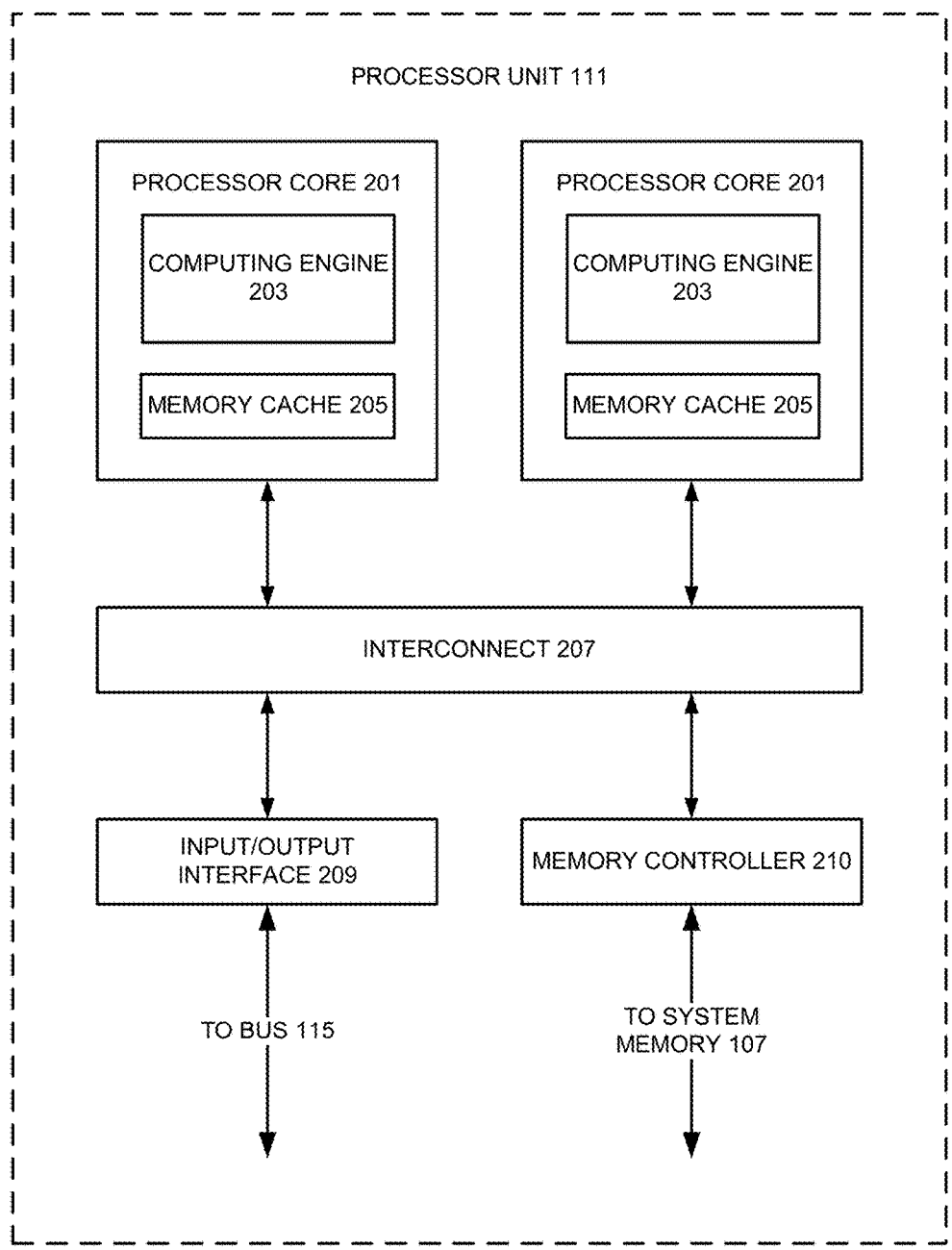
FIG. 2 illustrates an example of a multi-core processor unit that may be used to implement various embodiments of the disclosed technology.
Figure 3A:
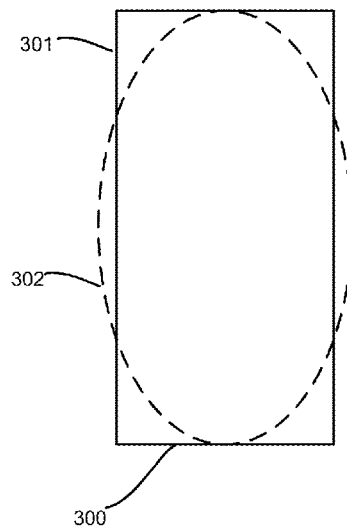
FIG. 3A illustrates a mask feature 300 and a simulated image of the mask feature.
Figure 3B:
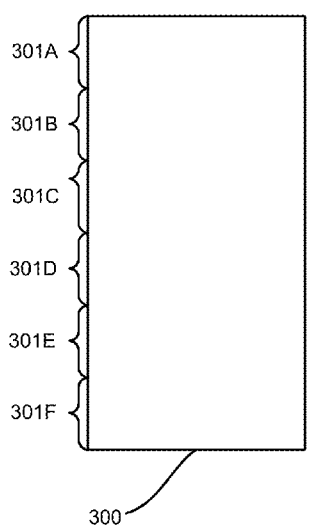
FIG. 3B illustrates an example of fragmentation of an edge of the mask feature 300.
Figure 3C:
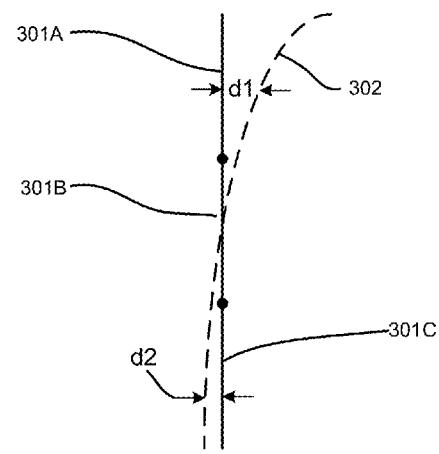
FIG. 3C illustrates edge displacement errors for some of the edge fragments.
Figure 3D:
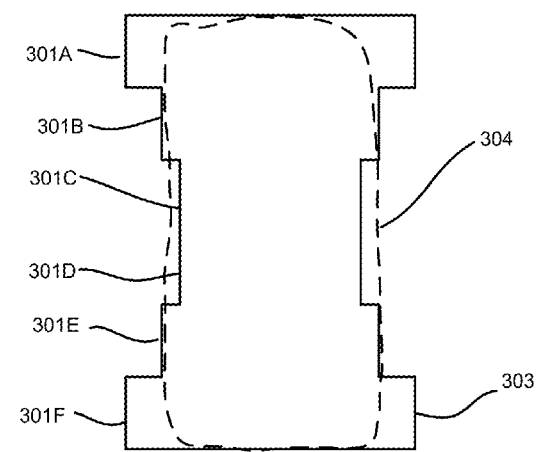
FIG. 3D illustrates a mask feature modified from the mask feature 300 by an OPC process and a corresponding simulated image.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the disclosed technology, the processor units 201 may include additional components, such as a high-level cache memory accessible shared by the processor cores 201.

While FIG. 2 shows one illustration of a processor unit 201 that may be employed by some embodiments of the disclosed technology, it should be appreciated that this illustration is representative only, and is not intended to be limiting. For example, some embodiments of the disclosed technology may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Domain Decomposition Methods (DDMs)

When the illumination of an object originates from a quasi-monochromatic, spatially incoherent light source, as is the case in lithography systems, there exists a method for calculating the image intensity that has the special appeal of conceptual simplicity. First, each point on the light source is considered individually and the image intensity produced by the light emitted from that single point is calculated. Then, the image intensity contributions from all points that comprise the light source are added, with a weighting factor proportional to the source intensity distribution. Simple addition or integration of the image intensity distributions can be performed, since the original source is assumed to be spatially incoherent. This is the theory proposed by Abbe, and the image intensity $I_i$ at point (u,v) can be computed using the following integral:

$$I_i(u, v) = \int\int_{-\infty}^{\infty} I_s(\alpha, \beta) \int\int\int\int_{-\infty}^{\infty} K(u, v; x_1, y_1)K^*(u, v; x_2, y_2) \times$$

$$F(x_1, y_1; \alpha, \beta)F^*(x_2, y_2; \alpha, \beta)$$

$$T_o(x_1, y_1)T_o^*(x_2, y_2)dx_1 dy_1 dx_2 dy_2 d\alpha d\beta.$$

Eq. 1 where $I_s$ is the source intensity, F and K are amplitude spread functions of the illuminating and imaging systems respectively, $T_o$ is the amplitude transmittance of the object (mask) and the asterisk represents complex conjugation.

In the theory proposed by Hopkins the image intensity calculation can alternatively be performed by using the following integral:

$$I_i(u, v) = \int\int_{-\infty}^{\infty}\int\int \left[\int\int_{-\infty}^{\infty} \overline{J_o}(f, g)\overline{K}(f + f', g + g')\overline{K}^*(f + f'',$$

$$g + g'')df dg\right] \times \overline{T_o}(f', g')$$

$$\overline{T_o}^*(f'', g'')e^{-j2\pi[(f'-f'')u+(g'-g'')v]}df' dg' df'' dg''.$$

Eq. 2 where $J_o$ is the source mutual intensity and the overbars represent Fourier transforms of the respective quantities. The image intensity $I_i$ as a function of image-space coordinates can be retrieved by the inverse Fourier transform of Eq. 2. The term inside the square brackets is often referred to as the transmission cross-coefficient (TCC) of the optical system. The TCC is independent of the object (the mask in photolithography) and is a complete description of the optical system from source to image plane. Note that the central assumption of Hopkins' theory is that the object transmission is independent of the illumination. As all illumination and imaging parameters are completely modeled in the TCC, the TCC can be pre-calculated and stored. The aerial images for mask patterns (layout patterns) can then be obtained by insert the mask transmittance function $T_0$ and the TCC into Eq. 2.

The disturbance U (any field component) at a point P behind a mask that is illuminated from a distant point source at $P_0$ can be approximated by the Kirchhoff-Fresnel diffraction integral, as shown in Eq. 3:

$$U(P) = -\frac{jAe^{jkr_0}}{2\lambda r_0}\int\int_W \frac{e^{jks}}{s}(1 + \cos\chi)dS$$

Eq. 3 where the integral extends over W, the mask's opening. The linearity of the Kirchhoff-Fresnel diffraction integral suggests that for a mask containing multiple openings $W_i$, the Eq. 2 becomes:

$$U(P) = \sum_i U_i(P)$$

Eq. 4 where $U_i(P)$ represents disturbance caused by each opening separately. Eq. 4 illustrates the essence of the domain decomposition method (DDM): every single opening (mask feature) of a mask may be considered separately and the scattered field below the mask is found as the sum of the scattered fields below each opening.

Rigorous simulation methods may be applied to determine the electromagnetic field below the mask. The determined steady-state near field can be regarded as a rigorous complex mask transmittance function $T_0$, or the r-mask model. The r-mask model accurately describes the scattering field near the mask. However, the simulation process can be computationally expensive even for a single rectangular mask opening due to the nature of three-dimensional simulation. The mask transmittance function $T_0$ may also be approximated by a function consisting of a piecewise constant function coinciding with the ideal mask transmission properties. This mask transmittance function $T_0$ is called the k-mask model. While no simulation is needed for determining the k-mask model, the k-mask model breaks down when either the minimum mask dimension layout feature is comparable to or less than the illumination wavelength, or the vertical structure of the mask is comparable to or greater than the illumination wavelength.

Figure 4:
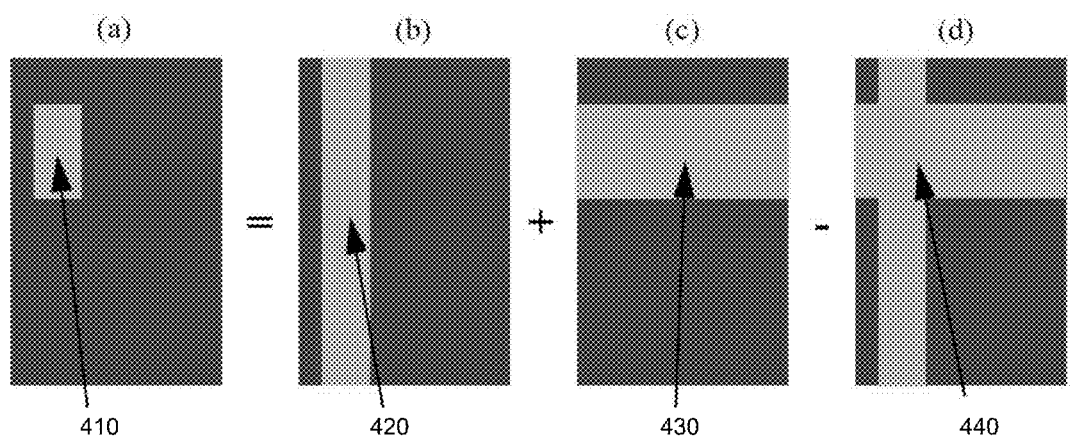
FIG. 4 illustrates an example of decomposing a mask feature.

Quasi-rigorous DDMs have been developed to achieve acceptable simulation accuracy without performing the slow three-dimensional simulation. In one quasi-rigorous DDM, each mask feature may be further decomposed into one-dimensional features and a two-dimensional k-mask feature. In FIG. 4, for example, the scattering field below the mask for feature 410 can be derived by combining the scattering fields for two one-dimensional features 420 and 430 and then subtracting the scattering field for a two-dimensional feature 440. The scattering field for feature 440 is described by a k-mask model and thus its determination requires no simulation. The scattering fields for features 420 and 430 can be obtained by executing two-dimensional simulations. To further speed up the process, the simulation results for one-dimensional features may be calculated and converted to transmission functions, i.e. the modified k-mask models. The modified k-mask models may then be stored in look-up tables for calculating aerial images for all mask features. Various function forms such as the rectangular form and the Gaussian form may be used for the modified k-mask models. The modified k-mask models for one-dimensional features in this quasi-rigorous DDM are referred to as DDM signals.

Figure 5:
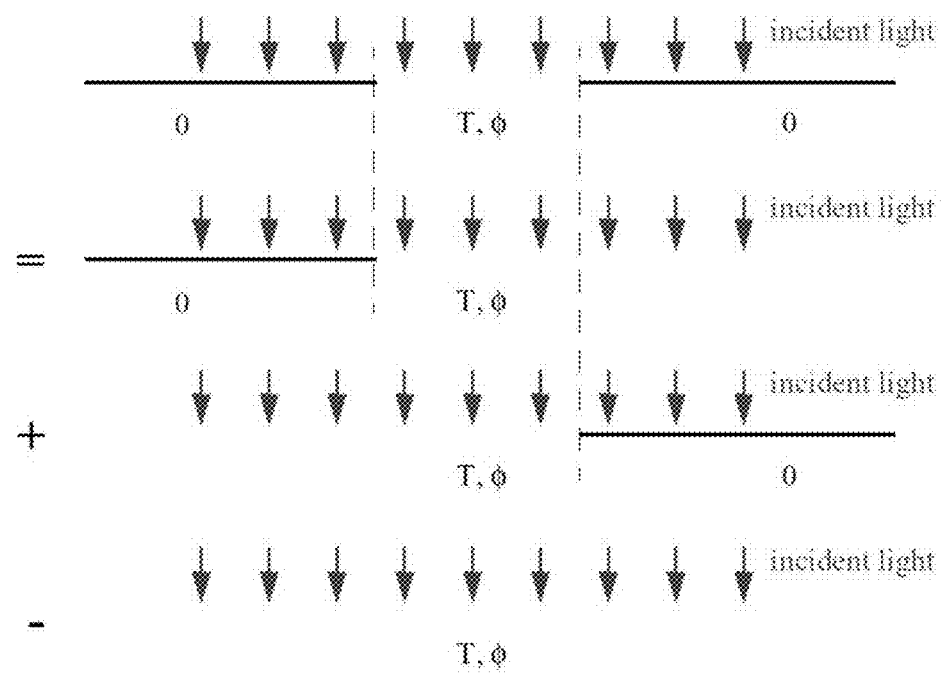
FIG. 5 illustrates an example of a one-dimensional mask opening being decomposed into two edges and a uniform field.

In another quasi-rigorous DDM, referred to as the edge-DDM, each mask feature is decomposed into edges. FIG. 5 illustrates an example of a one-dimensional mask opening being decomposed into two edges and a uniform field. The field across the observation plane (wafer plane) can be obtained based on the scattered fields for the two edges that can be determined by two-dimensional simulations. The application of the edge-DDM in two-dimensional layout features is straightforward. No matter how complicated the mask technology is, usually only a small number of different types of edges are present in the layout. Depending on the orientation of an edge in a layout feature, the edge "sees" and responds to the incident field differently. If the illuminated field is a TE normally incident plane wave and the edge is oriented along the y-axis, it "sees" TE illumination; but if it is oriented along the x-axis, it "sees" TM illumination. The response of each edge to its respective illumination can be taken into account rigorously from a pre-stored two-dimensional edge diffraction simulation. Corner effects may be effectively ignored, since the finite extent of each edge is not rigorously taken into account. Instead, the scattered field at the end points of every edge is abruptly terminated (truncated) in a perfect square-wave fashion to the field value of the k-mask model. Corner effects in typical imaging situations are mapped at the extremities of the spectra and usually do not contribute to the image formation. In this edge-DDM, the two dimensional edge diffraction simulation results are referred to as DDM signals, or more specifically edge-based DDM signals.

The above quasi-rigorous DDM methods are described in K. Adam, "Domain Decomposition Methods for the Electromagnetic Simulation of Scattering from Three-Dimensional Structures with Applications in Lithography," Electronics Research Laboratory, University of California, Berkeley, 2001, which is incorporated herein by reference. As noted previously, further additions to and/or improvement over the original DDM methods have been made including the incorporation of the impact of oblique incidence illumination angles via the Hybrid Hopkins-Abbe (HHA) method and the crosstalk modeling for DUV lithography.

Figure 6:
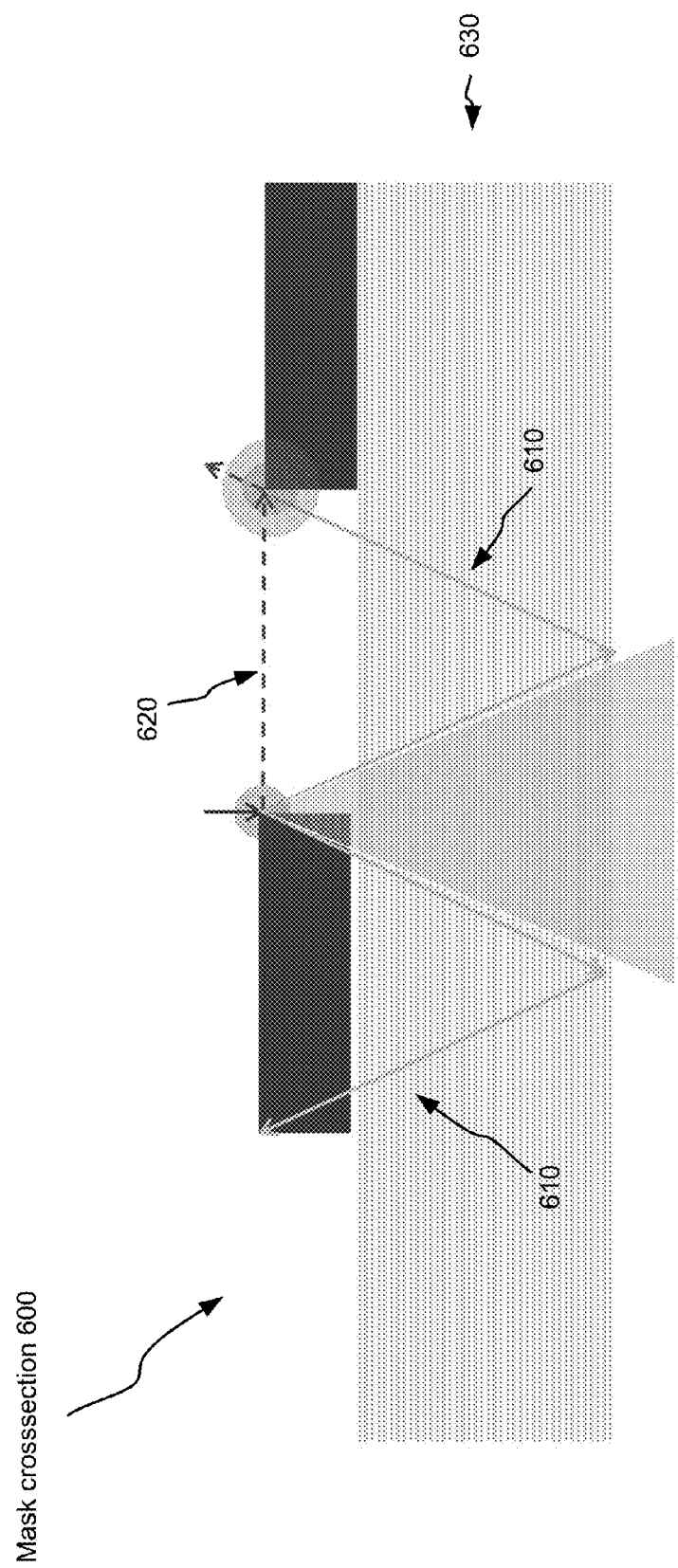
FIG. 6 illustrates cross section of a mask to show the physical mechanism of EUV crosstalk.

FIG. 6 illustrates cross section of a mask 600 to show the physical mechanism of EUV crosstalk. Unlike DUV crosstalk, re-scatter is too small to account for edge to edge interactions. This is because materials at EUV wavelengths have refractive indices extremely close to 1.0 (the same as air), and any reflection or diffraction (especially to high angles) has very small amount of energy because the amount of scattered energy is related to the different in refractive indices between two mediums. A simple reflection may produce a reflection coefficient (electric field) of about 0.04 of the original electric field of 1.0, which is 4%. For DUV crosstalk, light is scattered twice: one from a first layout feature component and the other from a nearby second layout feature component. This would result in a total reflection coefficient of 0.04*0.04=0.0016 of the original electric field being redirected back into the pupil (0.16%) in EUV as illustrated by line 620. This is a much smaller percentage than that in DUV.

For EUV crosstalk to have a substantive effect in the pupil, a single redirection is needed. Light scattered from the edge of a line is generally scattered down into a multilayer 630. This light will bounce around in the high-Q (resonant) multilayer 630 (a Bragg reflector) and all the small individual reflections will add in phase to produce a more dominant reflection. Since these reflected waves are traveling at oblique angles, each reflection in the multilayer slowly drifts energy away from the initial edge diffraction, allowing them to have a far reaching impact, travelling upwards up to 280 nm away from the mask edge location which is ~20 wavelengths. This reflected energy rising out of the multilayer is captured by DDM in how a single edge scatters. However, when a second edge is placed in the vicinity of the primary edge (ie., within the 280 nm radius), the upwards traveling reflection will have a secondary diffraction from the second edge which is not captured in edge based DDM which deals with how isolated edges diffract. An EUV crosstalk model needs to model the secondary diffraction of the reflected light.

EUV Crosstalk Modeling Tool

Figure 7:
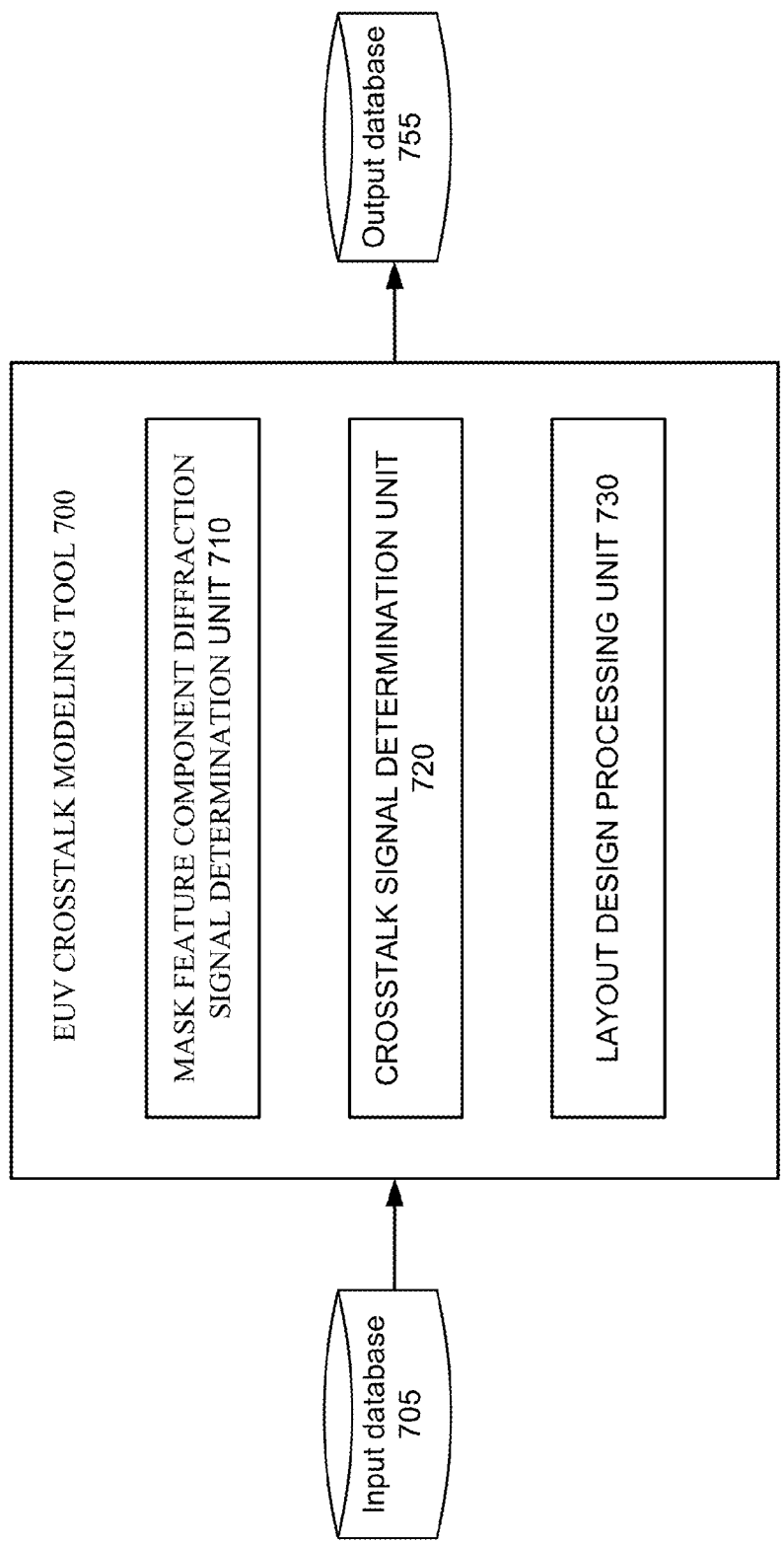
FIG. 7 illustrates an example of an EUV crosstalk modeling tool 700 according to various embodiments of the disclosed technology.

FIG. 7 illustrates an example of an EUV crosstalk modeling tool 700 according to various embodiments of the disclosed technology. As seen in this figure, the EUV crosstalk modeling tool 700 includes a mask feature component diffraction signal determination unit 710, a crosstalk signal determination unit 720, and a layout design processing unit 730. Some implementations of the EUV crosstalk modeling tool 700 may cooperate with (or incorporate) one or more of an input database 705 and an output database 755.

As will be discussed in more detail below, the EUV crosstalk modeling tool 700 can receive layout data for one or more layout designs from the input database 705. The mask feature component diffraction signal determination unit 710 determines isolated mask feature component diffraction signals associated with individual layout feature components in the one or more layout designs based on a component-based mask diffraction modeling method. The component-based mask diffraction modeling method may be the DDM method. The crosstalk signal determination unit 720 determines mask feature component diffraction signals based on the isolated mask feature component diffraction signals, the layout data and predetermined crosstalk signals. The predetermined crosstalk signals are derived based on mask feature component diffraction signals computed using an electromagnetic field solver and the component-based mask diffraction modeling method, respectively. The layout design processing unit 730 processes the one or more layout designs based on the mask feature component diffraction signals and the crosstalk signals. The EUV crosstalk modeling tool 700 stores results of the processed one or more layout designs in the output database 755.

As previously noted, various examples of the disclosed technology may be implemented by one or more computing systems, such as the computing system illustrated in FIGS. 1 and 2. Accordingly, one or more of the mask feature component diffraction signal determination unit 710, the crosstalk signal determination unit 720, and the layout design processing unit 730 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the mask feature component diffraction signal determination unit 710, the crosstalk signal determination unit 720, and the layout design processing unit 730. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the mask feature component diffraction signal determination unit 710, the crosstalk signal determination unit 720, and the layout design processing unit 730 are shown as separate units in FIG. 7, a single computer (or a single processor within a master computer) or a single computer system may be used to implement all of these units at different times, or components of these units at different times.

With various examples of the disclosed technology, the input database 705 and the output database 755 may be implemented using any suitable computer readable storage device. That is, either of the input database 705 and the output database 755 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 705 and the output database 755 are shown as separate units in FIG. 7, a single data storage medium may be used to implement some or all of these databases.

Correcting EUV Crosstalk Effect

Figure 8:
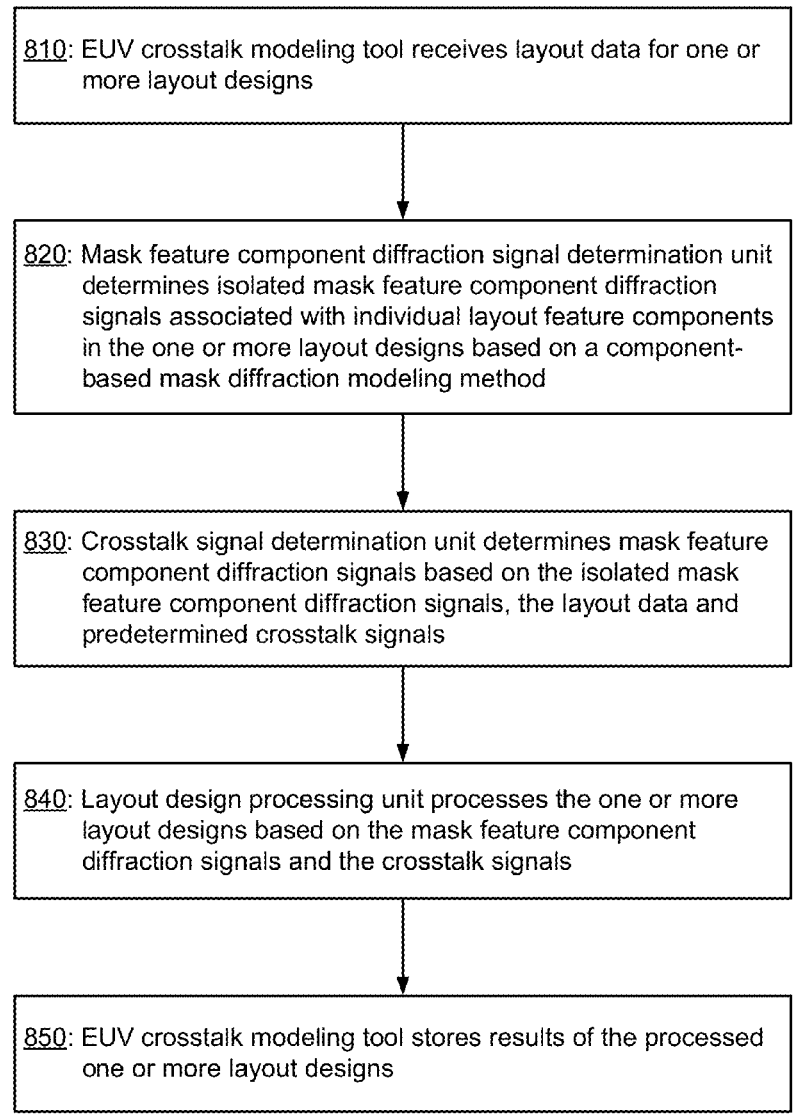
FIG. 8 illustrates a flowchart showing a process of correcting EUV crosstalk effects for lithography simulation that may be implemented according to various examples of the disclosed technology.

FIG. 8 illustrates a flowchart 800 showing a process of correcting EUV crosstalk effects for lithography simulation that may be implemented according to various examples of the disclosed technology. For ease of understanding, methods of correcting EUV crosstalk effects for lithography simulation that may be employed according to various embodiments of the disclosed technology will be described with reference to the EUV crosstalk modeling tool 700 in FIG. 7 and the flow chart 800 illustrated in FIG. 8. It should be appreciated, however, that alternate implementations of an EUV crosstalk modeling tool may be used to perform the methods of correcting EUV crosstalk effects for lithography simulation illustrated by the flow chart 800 according to various embodiments of the disclosed technology. Likewise, the EUV crosstalk modeling tool 700 may be employed to perform other methods of correcting EUV crosstalk effects for lithography simulation according to various embodiments of the disclosed technology.

In operation 810, the EUV crosstalk modeling tool 700 receives layout data for one or more layout designs. The layout data for one or more layout designs may be retrieved from the input database 805.

In operation 820, the mask feature component diffraction signal determination unit 710 determines isolated mask feature component diffraction signals associated with individual layout feature components in the one or more layout designs based on a mask feature component diffraction modeling method. The component-based mask diffraction modeling method is a method for rapidly simulating large mask areas while taking into account full electromagnetic field (EMF) solver information. The method utilizes the superposition principle to combine smaller EMF solutions together into a larger more complex structure. These smaller EMF solutions are referred to as mask feature component diffraction signals. When they are derived under the assumption of isolated layout feature component near fields (e.g., edge near fields) that interact solely based on superposition, these smaller EMF solutions are referred to as isolated mask feature component diffraction signals.

The combined near field solution is an approximation to the full EMF near field solution. The domain decomposition method (DDM) is an example of the component-based mask diffraction modeling method. In this method, isolated mask feature component diffraction signals are called isolated DDM signals. Methods of correcting EUV crosstalk effects for lithography simulation that may be employed according to various embodiments of the disclosed technology will be described with reference to the edge-DDM. It should be appreciated, however, that the disclosed technology can be applied to other component-based mask diffraction modeling methods.

Edges are basic building blocks of three dimensional features on a mask. Each feature can be decomposed into edges. No matter how complicated the mask technology is, usually only a small number of different types of edges are present in the layout. Depending on the orientation of an edge in a layout feature, the edge "sees" and responds to the incident field differently. The mask feature component diffraction signal determination unit 710 may employ an electromagnetic field (EMF) solver to derive isolated DDM signals for a number of different types of edges (e.g., different orientations) and store them in a lookup table. The electromagnetic field solver is a tool based solving Maxwell's equations. The isolated mask feature component diffraction signals for edges of the layout features (i.e., individual layout feature components) can be quickly determined by using the lookup table.

In operation 830, the crosstalk signal determination unit 720 determines mask feature component diffraction signals based on the isolated mask feature component diffraction signals, the layout data and predetermined crosstalk signals. The predetermined crosstalk signals are derived based on mask feature component diffraction signals computed using an electromagnetic field solver and the component-based mask diffraction modeling method, respectively.

Figure 9:
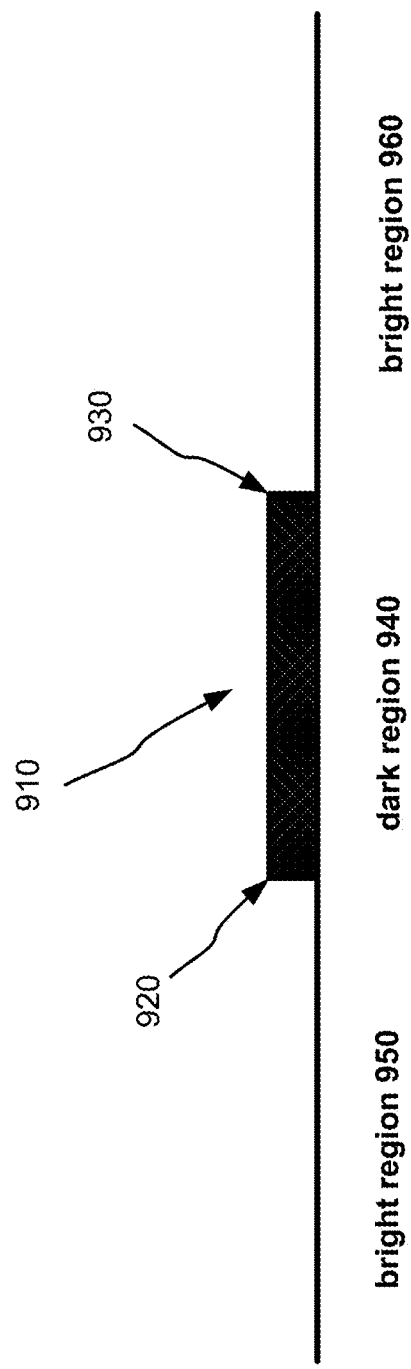
FIG. 9 illustrates cross section of an isolated line feature which is used to show how the predetermined crosstalk signals are determined according to various embodiments of the disclosed technology.

FIG. 9 illustrates cross section of an isolated line feature 910 which is used to show how the predetermined crosstalk signals are determined according to various embodiments of the disclosed technology. The isolated line feature 910 has two edges 920 and 930. The width of the isolated line feature 910 is very small (e.g., about 20 nm at the mask scale which may correspond to 5 nm at the wafer scale). In principle, the width can be smaller or larger, but crosstalk can be corrected for features which are greater than or equal to the feature simulated. For lithography purposes, a 5 nm wafer scale is sufficient to model the expected features sizes for EUV lithography's first introduction.

The crosstalk signal determination unit 720 uses both an electromagnetic field (EMF) solver and the mask feature component diffraction modeling method to compute mask feature component diffraction signals of the isolated line feature 910. The electromagnetic field (EMF) solver can be the same solver used by the mask feature component diffraction signal determination unit 710 to derive the lookup table.

Subtracting the mask feature component diffraction signals computed by the mask feature component diffraction modeling method from the mask feature component diffraction signals computed by the electromagnetic field solver leads to an error field, which can be treated as crosstalk signals.

DDM signals to the left of the edge 920 will correctly model the diffraction to the left of the edge 920 whenever there is a bright area. Since this feature was designed to be isolated, any electric field in the residual error to the left of the edge 920 (in bright region 950) does not come from this edge. However, if we look to the right of the edge 920, DDM signals will correctly capture the diffraction within any area that is dark. This means DDM on the left edge will correctly compute the diffraction to the right of the edge 920 within dark region 940, but will not capture the diffraction appropriately in the bright region because DDM assumed this region was dark. Therefore, any error electric field located in bright region 960 can be assumed to be error from the DDM approximation: a 'crosstalk signal' by the edge 920 to the edge 930. Similarly, any error electric field located in the bright region 950 can be assumed to be error from the DDM approximation: a 'crosstalk signal' by the edge 930 to the edge 920.

Figure 10:
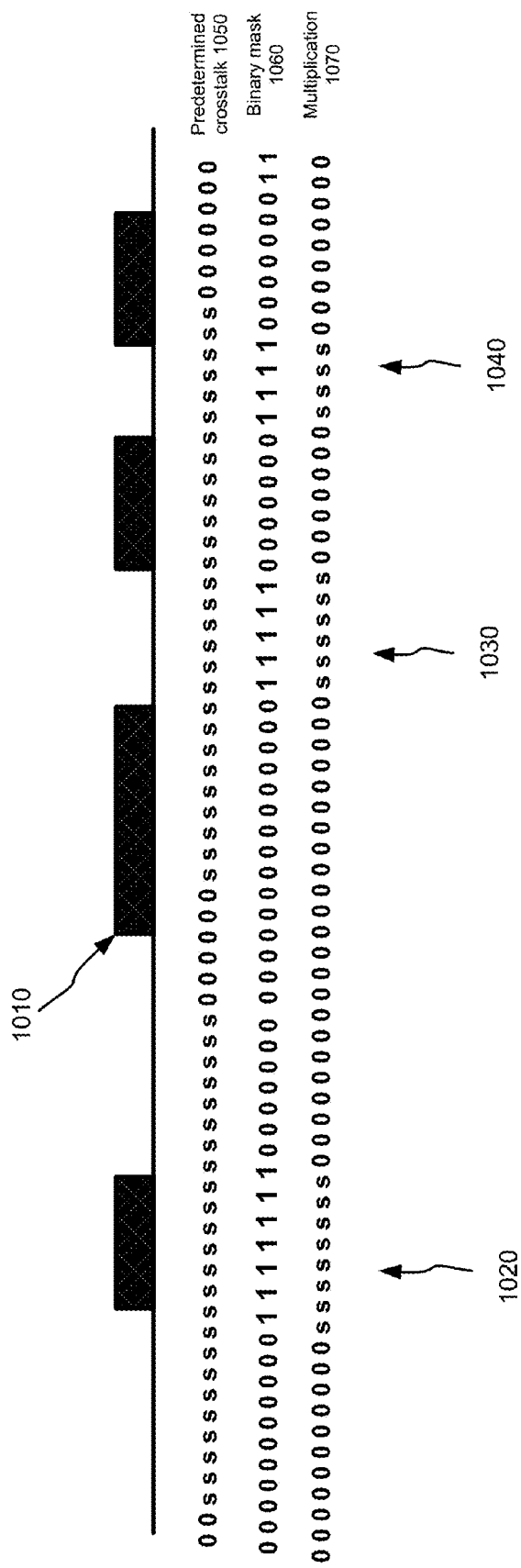
FIG. 10 illustrates how crosstalk signal by an edge can be determined in a layout design.

FIG. 10 illustrates how crosstalk signal by an edge 1010 can be determined in a layout design. Predetermined crosstalk signal of an edge is applied to regions that have opposite tone to the feature in question. In the figure, the edge 1010 is dark with respect to the region to its right and bright with respect to the region to its left. Layout data may be converted to binary masks: "0" where a region has the same tone and "1" where a region has the opposite tone, as shown as binary mask 1060 in FIG. 10. The predetermined crosstalk signals 1050 are indicated by "s" and the result of multiplication with the binary mask is shown as multiplication 1070 in FIG. 10.

Just like DDM signals are applied orthogonally to the edge in question, EUV crosstalk signals are also applied orthogonally to an edge. The crosstalk signal determination unit 720 can loop through all edges in the layout and raster dark feature crosstalk. The crosstalk signal determination unit 720 can then loop through the edges a second time and raster bright feature crosstalk.

In operation 840, the layout design processing unit 730 is configured to process a layout design based on the mask feature component diffraction signals. Using the mask feature component diffraction signals, the layout design processing unit 730 can determine aerial images for layout features in the layout design. In various embodiments of the disclosed technology, the sum-of-coherent-systems (SOCS) method may be used for approximating the Hopkins integral. The basics of the SOCS method is discussed in N. C. Cobb, "Fast Optical and Process Proximity Correction Algorithms for Integrated Circuit Manufacturing," Ph. D. Dissertation, University of California, Berkeley, 1998, which is incorporated herein by reference. The layout design processing unit 730 may also determine printed images for layout features in the layout design with photoresist models. Alternatively or additionally, the layout design processing unit 730 may perform an optical proximity correction (OPC) process on the layout design. The processed layout designs may be used to create EUV masks.

In operation 850, the EUV crosstalk modeling tool 700 stores results of the processed one or more layout designs in a tangible medium (e.g. the output database 780).

Conclusion

While the disclosed technology has been specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
   receiving layout data for one or more layout designs;
   determining isolated mask feature component diffraction signals associated with individual isolated layout feature components in the one or more layout designs based on a component-based mask diffraction modeling method;
   determining mask feature component diffraction signals based on the isolated mask feature component diffraction signals, the layout data, and predetermined crosstalk signals, wherein the predetermined crosstalk signals are differences between first isolated mask feature diffraction signals for an isolated layout feature computed using an electromagnetic field solver and second isolated mask feature diffraction signals for the isolated layout feature determined using the component-based mask diffraction modeling method;
   processing the one or more layout designs based on the mask feature component diffraction signals; and
   storing results of the processed one or more layout designs in a tangible medium.

2. The method recited in claim 1, wherein the processing the one or more layout designs comprises performing simulation to generate aerial images or printed images of layout features in the one or more layout designs.

3. The method recited in claim 2, wherein the simulation comprises applying a sum-of-coherent-systems (SOCS) method.

4. The method recited in claim 1, wherein the processing the one or more layout designs comprises performing an optical proximity correction (OPC) process on the one or more layout designs.

5. The method recited in claim 1, wherein the component-based mask diffraction modeling method is a domain decomposition method (DDM).

6. The method recited in claim 1, wherein the determining mask feature component diffraction signals comprises:
   converting the layout data to binary masks; and
   multiplying the predetermined crosstalk signals by the binary masks.

7. One or more non-transitory computer-readable media storing computer-executable instructions for causing one or more processors to perform a method, the method comprising:
   receiving layout data for one or more layout designs;
   determining first isolated mask feature component diffraction signals associated with individual isolated layout feature components in the one or more layout designs based on a component-based mask diffraction modeling method;

determining mask feature component diffraction signals based on the isolated mask feature component diffraction signals, the layout data, and predetermined crosstalk signals, wherein each predetermined crosstalk signal represents a difference between a first isolated mask feature diffraction signal for an isolated layout feature computed using an electromagnetic field solver and a second isolated mask feature diffraction signal for the isolated layout feature component determined using the component-based mask diffraction modeling method;

processing the one or more layout designs based on the mask feature component diffraction signals; and storing results of the processed one or more layout designs in a tangible medium.

8. The one or more non-transitory computer-readable media recited in claim 7, wherein the processing the one or more layout designs comprises performing simulation to generate aerial images or printed images of layout features in the one or more layout designs.

9. The one or more non-transitory computer-readable media recited in claim 8, wherein the simulation comprises applying a sum-of-coherent-systems (SOCS) method.

10. The one or more non-transitory computer-readable media recited in claim 7, wherein the processing the one or more layout designs comprises performing an optical proximity correction (OPC) process on the one or more layout designs.

11. The one or more non-transitory computer-readable media recited in claim 7, wherein the component-based mask diffraction modeling method is a domain decomposition method (DDM).

12. The one or more non-transitory computer-readable media recited in claim 7, wherein the determining mask feature component diffraction signals comprises:

converting the layout data to binary masks; and multiplying the predetermined crosstalk signals with the binary masks.

13. A system, comprising:

one or more processors with memory attached thereto, the one or more processors programmed to perform a method, the method comprising:

receiving layout data for one or more layout designs;

determining mask feature component diffraction signals using the layout data and predetermined crosstalk signals, wherein at least one of the predetermined crosstalk signals is a difference between a first isolated mask feature diffraction signal for an isolated layout feature component computed using an electromagnetic field solver and a second isolated mask feature diffraction signal for the corresponding isolated layout feature component computed using a component-based mask diffraction modeling method;

processing the one or more layout designs based on the mask feature component diffraction signals; and storing results of the processed one or more layout designs in a tangible medium.

14. The system recited in claim 13, wherein the processing the one or more layout designs comprises performing simulation to generate aerial images or printed images of layout features in the one or more layout designs.

15. The system recited in claim 13, wherein the processing the one or more layout designs comprises performing an optical proximity correction (OPC) process on the one or more layout designs.

16. The system recited in claim 13, wherein the component-based mask diffraction modeling method is a domain decomposition method (DDM).

17. The system recited in claim 13, wherein the determining mask feature component diffraction signals comprises:

converting the layout data to binary masks; and multiplying the predetermined crosstalk signals with the binary masks.

18. The system of claim 13, wherein the method further comprises decomposing mask features of the one or more layout designs into respective layout feature components, and wherein the layout feature components comprise a plurality of edges.

19. The method of claim 1, wherein the processing the one or more layout designs further comprises looping through a plurality of feature components in the one or more layout designs.

20. The one or more non-transitory computer-readable media recited in claim 7, wherein the first isolated mask feature component diffraction signals are stored in or retrieved from a lookup table.

* * * * *